US012035512B2

(12) United States Patent
Feldhaus et al.

(10) Patent No.: US 12,035,512 B2
(45) Date of Patent: Jul. 9, 2024

(54) COOLING DEVICE AND ELECTROMAGNETIC INDUCTION CHARGING DEVICE

(71) Applicant: Mahle International GmbH, Stuttgart (DE)

(72) Inventors: Georg Feldhaus, Stuttgart (DE); Thomas Himmer, Reichenbach (DE); Martin Steinbach, Waiblingen (DE)

(73) Assignee: Mahle International GmbH (DE)

(*) Notice: Subject to any disclaimer, the term of this patent is extended or adjusted under 35 U.S.C. 154(b) by 381 days.

(21) Appl. No.: 17/489,768

(22) Filed: Sep. 29, 2021

(65) Prior Publication Data

US 2022/0104404 A1   Mar. 31, 2022

(30) Foreign Application Priority Data

Sep. 30, 2020   (DE) .................. 10 2020 212 383.7

(51) Int. Cl.
  *H05K 7/20*   (2006.01)
  *B60L 53/12*   (2019.01)

(52) U.S. Cl.
  CPC .......... *H05K 7/20909* (2013.01); *B60L 53/12* (2019.02); *H05K 7/20927* (2013.01)

(58) Field of Classification Search
  CPC ............ H05K 7/20909; H05K 7/20927; B60L 53/12; B60L 53/302; H01F 27/025; H01F 27/10; H01F 38/14; Y02T 10/70; Y02T 10/7072; Y02T 90/12; Y02T 90/14
  See application file for complete search history.

(56) References Cited

U.S. PATENT DOCUMENTS

| 10,118,497 | B2 | 11/2018 | Garcia |
| 10,688,873 | B2 | 6/2020 | Götz |
| 11,292,363 | B2 | 4/2022 | Shimauchi |
| 11,521,789 | B2 | 12/2022 | Laemmle |

(Continued)

FOREIGN PATENT DOCUMENTS

| CN | 102231542 A | 11/2011 |
| CN | 106715187 A | 5/2017 |

(Continued)

OTHER PUBLICATIONS

German Search Report for DE-102020212383.7, dated May 19, 2021.

(Continued)

*Primary Examiner* — Emmanuel E Duke
(74) *Attorney, Agent, or Firm* — Fishman Stewart PLLC

(57) ABSTRACT

A cooling device for an electromagnetic induction charging device for inductive charging of a motor vehicle with electrical energy. The cooling device may include a housing, an air path, a coolant path, a heat exchanger, and a fan. The housing may include an upper housing shell and a lower housing shell, which may surround a housing interior. The heat exchanger and the fan may be arranged in the housing interior. The air path and the coolant path may be arranged in the housing interior fluidically separated from one another. The coolant path and the air path may be directed through the heat exchanger such that, in the heat exchanger, heat is transferrable from coolant in the coolant path to air in the air path. The fan may be arranged upstream of the heat exchanger in the air path.

31 Claims, 8 Drawing Sheets

(56) References Cited

U.S. PATENT DOCUMENTS

| | | | |
|---|---|---|---|
| 2006/0179871 | A1 | 8/2006 | Wagner |
| 2007/0284094 | A1 | 12/2007 | Pawlak et al. |
| 2012/0326663 | A1 | 12/2012 | You |
| 2018/0201152 | A1 | 7/2018 | Newman |
| 2018/0370374 | A1 | 12/2018 | Gotz et al. |
| 2019/0241093 | A1 | 8/2019 | Shimauchi |
| 2020/0143978 | A1 | 5/2020 | Laemmle |
| 2020/0251929 | A1 | 8/2020 | Partovi |
| 2023/0089953 | A1 | 3/2023 | Angermeier |

FOREIGN PATENT DOCUMENTS

| | | | |
|---|---|---|---|
| CN | 109109678 A | | 1/2019 |
| CN | 208827571 U | * | 5/2019 |
| CN | 110116613 A | | 8/2019 |
| CN | 111137160 A | | 5/2020 |
| CN | 115427254 A | | 12/2022 |
| EP | 3065152 A1 | | 9/2016 |
| JP | 2012228122 A | | 11/2012 |
| JP | 2020013726 A | | 1/2020 |
| WO | 2012031721 A2 | | 3/2012 |
| WO | 2012090342 A1 | | 7/2012 |
| WO | 2016143341 A1 | | 9/2016 |

OTHER PUBLICATIONS

Chinese Search Report, CN202111151030.9, dated Feb. 5, 2024 (with translation).
Chinese Office Action, CN202111151030.9, dated Feb. , 2024 (with translation).

* cited by examiner

COOLING DEVICE AND ELECTROMAGNETIC INDUCTION CHARGING DEVICE

CROSS-REFERENCE TO RELATED APPLICATIONS

This application claims priority to German Patent Application No. DE 10 2020 212 383.7, filed on Sep. 30, 2020, the contents of which is hereby incorporated by reference in its entirety.

TECHNICAL FIELD

The invention relates to a cooling device for an electromagnetic induction charging device for the inductive charging of a motor vehicle with electrical energy. The invention relates furthermore to an electromagnetic induction charging device with such a cooling device.

BACKGROUND

Usually, the principle of electromagnetic induction is used for the wireless and contactless charging of at least partially electrified motor vehicles, which usually comprise an electrical energy storage device for storing electrical energy which is supplied to the motor vehicle during charging. Here, for the wireless charging of such motor vehicles, electromagnetic induction charging devices having at least one electromagnetic (transmitter) coil are used, by means of which an electric current can be induced in at least one electromagnetic (receiver) coil which is present in the vehicle and is electrically connected with the electrical energy storage device. The electrical energy storage device of the motor vehicle can be a traction battery, which serves for supplying an electric drive of the motor vehicle with electrical energy. An "at least partially electrified" motor vehicle uses at least electricity as energy carrier for its drive, but can also use, moreover, further energy carriers, so that the term expressly includes both pure electric vehicles and also hybrid vehicles. In a typical arrangement for the wireless charging of at least partially electrified motor vehicles, the electromagnetic induction charging device is mounted on a substrate, so that the motor vehicle which is to be charged can travel with its underbody, on which the electromagnetic receiver coil is present, over the electromagnetic induction charging device. The motor vehicle is therefore parked over the induction charging device, so that the receiver coil of the motor vehicle is arranged above the (transmitter) coil on the substrate. Such electromagnetic induction charging devices are also designated as "ground assemblies", because they are arranged on the substrate. In the case of such "ground assemblies", an outer surface of the induction charging device facing away from the substrate is usually exposed. However, it is not unusual to introduce such ground assemblies under a concrete surface, which then covers the free outer surface of the induction charging device.

In operation of such an electromagnetic induction charging device, i.e. in the case of the inductive transmission of electrical energy between motor vehicle and induction charging device, the induction charging device typically generates waste heat. The waste heat can lead to the functional impairment or even damage of heated components of the induction charging device. In addition, in conventional induction charging devices, the waste heat can lead in a disadvantageous manner to the exposed outer surface of the induction charging device being able to be heated to a surface temperature of more than 60° C. However, a surface which is hot in such a manner poses a high risk of injury if a person—intentionally or unintentionally—comes into contact with it.

SUMMARY

It is therefore an object of the present invention—in particular for reducing the risk of injury explained above—to indicate new ways for a cooling device for an electromagnetic induction charging device.

This problem is solved by the subject matter of the independent claim(s). Preferred embodiments are the subject matter of the dependent claim(s).

The basic idea of the invention is, accordingly, to realize a cooling device for an electromagnetic induction charging device for the inductive charging of a motor vehicle with electrical energy, with a single coolant path and with at least one air path, wherein coolant which is present in the coolant path is coupled by means of at least one heat exchanger thermally to air which is directed through the air path, so that heat is extracted from the coolant which is directed through the coolant path in the heat exchanger and can be transferred there to the air which is directed through the air path. In the heat exchanger therefore the air path and the coolant path comes thermally in conduct in fluidically separated manner from one another.

Advantageously, a particularly effective heat dissipation of heat entrained by the coolant can thus be achieved, which as a consequence thereof can be kept away from an exposed surface of an electromagnetic induction charging device which is equipped with such a cooling device. This makes it possible to at least reduce in a desirable manner, ideally even to rule out entirely, the risk of injury described in the introduction.

A cooling device according to the invention is configured for use in an electromagnetic induction charging device for the inductive charging of a motor vehicle with electrical energy. The cooling device comprises a housing comprising an upper and a lower housing shell, which surrounds a housing interior. The cooling device comprises, in addition, at least one, in particular precisely one, air path, arranged in the housing interior, for flowing through with air from an environment of the cooling device, and with a coolant path, arranged in a fluidically separate manner with respect to the air path in the housing interior, for flowing through with a coolant. The cooling device further comprises at least one, in particular precisely one, heat exchanger arranged in the housing interior, wherein the coolant path is directed through the heat exchanger, and the air path is directed through the heat exchanger, so that in the heat exchanger heat can be transferred from the coolant to the air for the cooling of the coolant. Furthermore, the cooling device comprises at least one, in particular precisely one, fan arranged in the housing interior, in particular a radial fan, wherein the fan is arranged upstream of the heat exchanger in the air path. Advantageously, a particularly effective heat dissipation of heat entrained by the coolant can thus be achieved, which as a consequence thereof can be kept away from an exposed surface of an electromagnetic induction charging device which is equipped with such a cooling device. This makes it possible to at least reduce in a desirable manner, ideally even to rule out entirely, the risk of injury which was described in the introduction.

In a preferred embodiment, a first and a second air path and a first and a second heat exchanger are arranged in the housing interior, wherein the coolant path is directed through both heat exchangers and the first air path is directed through the first heat exchanger and the second air path is directed through the second heat exchanger, so that in the heat exchangers for the cooling of the coolant, heat can be transferred from the coolant to the air, wherein the first heat exchanger is arranged upstream of the second heat exchanger in the coolant path. In this embodiment, in the housing interior furthermore a first and a second fan are arranged, wherein the first fan is arranged upstream of the first heat exchanger in the first air path, and the second fan is arranged upstream of the second heat exchanger in the second air path.

Therefore in this embodiment a cooling device is realized for an electromagnetic induction charging device for the inductive charging of a motor vehicle with electrical energy, with a single coolant path and with two separate air paths, wherein coolant which is present in the coolant path is coupled by means of a first and by means of a second heat exchanger thermally to air which is directed through the two air paths, so that heat can be extracted from the coolant directed through the coolant path, in the heat exchangers, and can be transferred there to the air which is directed through the air paths. According to the invention therefore the first and the second heat exchanger are both arranged in the coolant path, wherein the first heat exchanger is arranged in the first air path and the second heat exchanger is arranged in the second air path. In the first heat exchanger therefore the first air path and the coolant path come thermally in contact in a manner fluidically separated from one another, whereas in the second heat exchanger the second air path and the coolant path come thermally in contact in a manner fluidically separated from one another.

Advantageously, therefore, heat can be extracted from the coolant, directed through the coolant path, in two separate cooling registers formed by the two air paths. This permits a particularly effective heat dissipation of heat which is entrained by the coolant, which in consequence thereof can be kept away from an exposed surface of an electromagnetic induction charging device which is equipped with such a cooling device. This makes it possible in a desirable manner to at least reduce, ideally even to rule out entirely, the risk of injury which was described in the introduction. Moreover, the components of the induction charging device can be protected from overheating as a result of entered waste heat.

In a preferred further development of the cooling device, a coolant pump for conveying the coolant through the coolant path is arranged in the coolant path, preferably upstream of the first heat exchanger. This permits a particularly effective heat dissipation of the waste heat occurring in an induction charging device which is equipped with the cooling device.

According to a further advantageous further development of the cooling device, the first and the second air path are configured in the housing interior in a fluidically separated manner from one another. This advantageously guarantees a reliable and respectively autonomous supplying of the two heat exchangers with air.

A further preferred further development of the cooling device makes provision that the two fans are arranged between the two heat exchangers in the housing interior. Such a cooling device is advantageously of particularly compact size.

In a further preferred further development, the two air paths, the two heat exchangers, preferably also the two fans, are arranged with respect to one another substantially mirrored with respect to a shared mirror axis, preferably axially symmetrically with respect to a symmetry axis. This also has an advantageous effect on a package of the cooling device.

The term "substantially mirrored" can also comprise here expressly a structure in which the fans rotate in the same direction rather than in mirrored directions, wherein then the guiding of the air paths, coordinated therewith, and hence the precise arrangements of the components likewise do not have to be arranged in a strictly mirrored manner.

According to a further advantageous further development of the cooling device, the two heat exchangers are arranged in the housing interior in a V-shaped manner with respect to one another. Thus, advantageously, heat exchangers of particularly large size and hence particularly powerful, can be accommodated in a spatially limited installation space which is established by the housing interior.

In a further preferred further development of the cooling device, the first and the second heat exchanger extend substantially in each case along one of two legs of a heat exchanger V-geometry. The first and the second air path extend substantially in each case along one of two legs of an air path V-geometry. The heat exchanger V-geometry and the air path V-geometry overlap one another, so that together they form a hash(#)-geometry. Thereby—in relation to the installation space established by the housing interior—a particularly large amount of heat can be transferred from the coolant to the air which is directed through the air paths and can be delivered to the external environment.

According to a further advantageous further development of the cooling device, the two heat exchangers are arranged in the coolant path connected fluidically consecutively and by means of a coolant duct, preferably a coolant hose of a flexible material. Such a cooling device is able to be implemented in a technically particularly simple manner.

In a further preferred further development of the cooling device, provision is made that in the coolant path, preferably downstream of the second heat exchanger, particularly preferably between the second heat exchanger and a coolant outlet, an equalizing receptacle is arranged for the equalizing of changes in volume of the coolant which is directed through the coolant path. Advantageously, it can thus be ensured that a sufficient quantity of coolant is always present in the coolant path. The coolant path can be filled with coolant via the equalizing receptacle.

In a preferred further development, the equalizing receptacle delimits a receptacle interior for receiving the coolant. The equalizing receptacle has here an inlet connection piece, facing away from the receptacle interior, protruding outwards from the equalizing receptacle, for letting in the coolant into the receptacle interior, and an outlet connection piece, facing away from the receptacle interior, protruding outwards from the equalizing receptacle, for letting out the coolant out from the receptacle interior, by means of which connection piece the equalizing receptacle is fluidically integrated into the coolant path. The equalizing receptacle comprises a filling connection piece for filling the equalizing receptacle, preferably for filling the coolant path, with coolant. Here, the filling connection piece projects into the receptacle interior and connects the outlet connection piece fluidically with the receptacle interior. Advantageously, the equalizing receptacle can therefore be used, as it were, for realizing a filling function and a buffer storage of coolant.

In a preferred further development of the cooling device, the outlet connection piece is arranged in extension of the filling connection piece. Thus, via the filling connection piece, the coolant path can be filled with coolant particularly well.

Expediently, the inlet connection piece and the outlet connection piece are arranged opposite one another. This leads to a throughflow of the receptacle interior with particularly low flow resistance.

According to a further advantageous further development of the cooling device, the filling connection piece is configured in an angled manner. Such a filling connection piece is accessible particularly well.

In a further preferred further development of the cooling device, the equalizing receptacle has a receptacle opening which is closed or able to be closed by means of a detachable cover, with a filling opening of the filling connection piece pointing in the direction of said receptacle opening. Expediently, the receptacle opening and the filling opening are aligned with respect to a gravity direction, when the cooling device is situated in its operating position. Advantageously, the filling opening of the filling connection piece is therefore accessible very well through the receptacle opening when the cover is removed, which simplifies a filling of the coolant path with coolant.

According to a further advantageous further development of the cooling device, the receptacle opening and the filling opening of the filling connection piece are aligned, so that when the cover is detached, simultaneously coolant can be filled into the filling connection piece via the filling opening and the receptacle interior can be vented via the filling opening. Thus, as it were, a filling function and a venting function can be realized.

In a further advantageous further development of the cooling device according to the invention, the upper housing shell is connected by its shell edge with a shell edge of the lower housing shell, wherein the two shell edges are joined to one another in a joining plane. Undesired leakages of the housing can thereby be effectively prevented. In addition, such a connection can be produced at a very favourable cost, which has a cost-reducing effect on the production costs of the cooling device.

According to a further preferred further development of the cooling device according to the invention, the lower housing shell comprises, facing the housing interior, in each case integrally a first fan housing of the first fan and a second fan housing of the second fan. Here, the lower housing shell comprises, facing the housing interior, at least one integral flow-guiding element for guiding the air through the first or respectively second air path. Any assembly steps for the assembly of separate fan housings or respectively flow-guiding elements on the housing thus become obsolete, which has a cost-reducing effect on the production costs of the cooling device.

According to a further advantageous further development of the cooling device, a covering is arranged on the upper housing shell, wherein an intermediate space, formed between the upper housing shell and the covering, forms a first air inlet path for feeding the air to the first fan, and a second air inlet path for feeding the air to the second fan. Such a cooling device can be realized in a particularly mechanically stable manner. As a result of the multiple function of the housing shells and the covering, the number of components is also reduced. Moreover, the covering prevents a penetration of fluids, in particular splash water or rain, into the air paths.

In a further preferred further development of the cooling device, the first and the second air inlet path are configured in a fluidically separated manner from one another. Alternatively, the first and the second air inlet path together form a main air inlet path, in which the first and the second air inlet path are fluidically connected with one another. In the case of the fluidically separate realization of the air inlet paths, the result is that the air which is fed to the air paths is not removed exclusively from a small region of the external environment. This reduces the likelihood of a complete failure of the cooling device if in the external environment locally only comparatively warm or dirty air is available. In other words, the cooling device—even if not in entirety—can exercise its cooling function, even when only comparatively warm or dirty air is fed to one of the air paths, however with air of better air quality being fed to the other air path.

According to a further preferred further development of the cooling device, the covering comprises receiving elements, which are preferably configured respectively as an aperture, in which fastening elements, preferably fastening screws, are able to be received or respectively are received for fixing the covering and the entire cooling device on a surface, in particular on a substrate or respectively a roadway. This permits a fastening of the cooling device on the substrate or respectively roadway which is able to be realized technically in a particularly simple manner.

According to a further advantageous further development of the cooling device, the second fan is arranged in a second air inlet for the introducing of air into the second air path, wherein preferably the second air inlet communicates fluidically with the second air inlet path. Alternatively or additionally, the first fan is arranged in a first air inlet for the introducing of air into the first air path, wherein preferably the first air inlet communicates fluidically with the first air inlet path. An air stream of air flowing through the air paths can thus be initiated and maintained particularly well. At the same time, such a cooling device is of particularly compact size. Moreover, the space between the air inlets can be used for accommodating an electrical connection and current supply lines of the cooling device and/or of the induction charging device.

A further advantageous further development of the cooling device makes provision that upstream of the first fan a first supply air filter device is arranged for filtering the air entering into the first air path. Respectively alternatively or additionally, upstream of the second fan a second supply air filter device is arranged for filtering the air entering into the second air path, downstream of the first heat exchanger a first exhaust air filter device is arranged for filtering the air exiting from the first air path or/and downstream of the second heat exchanger a second exhaust air filter device is arranged for filtering the air exiting from the second air path. By means of such filter devices, it can be ensured on the one hand that no foreign bodies arrive from the external environment into the housing interior. On the other hand, it is prevented that dirt or similar arrives from the housing interior into the environment.

According to a further preferred further development of the cooling device, at least one of the filter devices, preferably all filter devices, is/are configured respectively as a filter cassette which is able to be used exchangeably. Such a cooling device can be maintained with particularly little effort, if the filter device which is realized as a filter cassette is worn or respectively contaminated. Alternatively or additionally, such a filter device can comprise a grid, in particular a metal grid. Moreover, drainage slots can be provided respectively on the filter devices, via which fluid which has arrived in an undesired manner into the air inlet paths can be directed away from the respective fan as a result of the effect of gravity.

In a further preferred further development of the cooling device, in a top view onto the upper or lower housing shell, the housing has the geometric shape of a rectangle with a first and second wide side and with a first and second narrow side. Here, the first and second air inlet are both arranged in the first wide side. A coolant inlet and the coolant inlet of the coolant out of the coolant path are arranged in the second longitudinal side opposite the first longitudinal side. Coolant lines which are able to be connected to the coolant inlet or respectively to the coolant outlet can thus be kept particularly short in an advantageous manner.

Expediently, by means of the cooling unit, a cooling design can be configured for cooling a main part of an electromagnetic induction charging device comprising the cooling unit, in which a cooling with air of the most relevant components provided in the main part takes place, and then a transfer of the waste heat to a coolant. Here, the fans, heat exchanger, pump, equalizing receptacle can be combined as a module in the housing interior, wherein the module is separate from the main part of the induction charging device. The cooling device can communicate here with the main part of the induction charging device exclusively via coolant lines and possibly current lines. The cooling device can be docked on the main part or can even be entirely separate from the main part.

In a further advantageous further development of the cooling device, the first air path opens into a first air outlet, arranged in the housing, for guiding the air out of the housing interior, and the second air path opens into a second air outlet, arranged in the housing, for guiding the air out of the housing interior. Here, the first air outlet is arranged in the first narrow side and the second air outlet is arranged in the second narrow side opposite the first narrow side. The air outlets are therefore arranged as far as possible to the exterior and with as great a distance from one another as possible on the cooling device, so that a return heat input of heat entrained by the air flowing out through the air outlets into the cooling device can be kept small. Moreover, a flow cross-section at the air inlet and at the air outlet can be configured to be sufficiently and similarly large, which is advantageous especially for pressure drop reasons.

Expediently at least one, preferably both, of the heat exchangers is/are configured as a tube bundle heat exchanger. Such heat exchangers are proved to be particularly effective.

According to an advantageous further development of the cooling device, a boundary surface of the upper housing shell, delimiting an air inlet path, in operating position of the cooling device runs at least partially at a gradient, so that fluid penetrating into the air inlet path is directed away from the at least one fan due to gravity. Advantageously, the housing interior and the components of the cooling device arranged therein, can be protected in particular from splash water or respectively rain.

According to an advantageous further development of the cooling device, the boundary surfaces of the upper housing shell delimiting the air inlet paths in operating position of the cooling device run at least partially at a gradient, so that fluid penetrating into the air inlet paths is directed away from the fans due to gravity. Advantageously, the housing interior and the components of the cooling device arranged therein can thus be protected from fluid, in particular from splash water or respectively rain.

Expediently the air inlet path can be delimited by the upper housing half and the covering. The covering can have an opening for the air which is not arranged at the same site, in particular not at the same height with respect to a gravity direction in operating position as a corresponding opening of the upper covering. In the case of standing water outside the cooling device (e.g. flooding), the water level must first surpass this shaft height before water penetrates into the cooling device.

The invention relates moreover to an electromagnetic induction charging device with a cooling device according to the invention and described above. Furthermore, the induction charging device comprises an electromagnetic resonator for the inductive transmission of electrical energy to the motor vehicle, wherein the coolant path communicates fluidically with the resonator so that the resonator is able to be cooled by means of coolant which is directed through the coolant path. The advantages, indicated above, of the cooling device according to the invention apply also to the induction charging device, according to the invention, with such a cooling device.

In a preferred further development of the induction charging device, the coolant path is part of a closed coolant circuit which preferably runs entirely within the induction charging device. A regular introducing of often environmentally harmful coolant into the environment is thus advantageously prevented. Moreover, an induction charging device with integrated coolant circuit is very compact in size and therefore requires only little installation space.

According to a further advantageous further development of the induction charging device, the resonator is arranged in the housing interior of the housing of the cooling device. Alternatively, the resonator is arranged in a resonator housing which is formed separately from the housing of the cooling device. In the case where the induction charging device and resonator share one and the same housing, the costs for a separate resonator housing can be saved. On the other hand, the separate embodiment of the housing of the cooling device and of the resonator housing allows differently designed resonators to be able to be combined with a uniformly designed cooling device.

Expediently, the cooling device or respectively the induction charging device is designed for being travelled over by a vehicle. Therefore, the cooling module has various webs, struts, ribs etc., which can partly at the same time also direct the air as guide elements.

Further important features and advantages of the invention will emerge from the subclaims, from the drawings and from the associated figure description with the aid of the drawings.

It shall be understood that the features mentioned above and to be explained further below are able to be used not only in the respectively indicated combination, but also in other combinations or in isolation, without departing from the scope of the present invention.

Preferred example embodiments of the invention are illustrated in the drawings and are explained more closely in the following description, wherein the same reference numbers refer to identical or similar or functionally identical components.

BRIEF DESCRIPTION OF THE DRAWINGS

There are shown, respectively schematically

DETAILED DESCRIPTION

Figure 1:
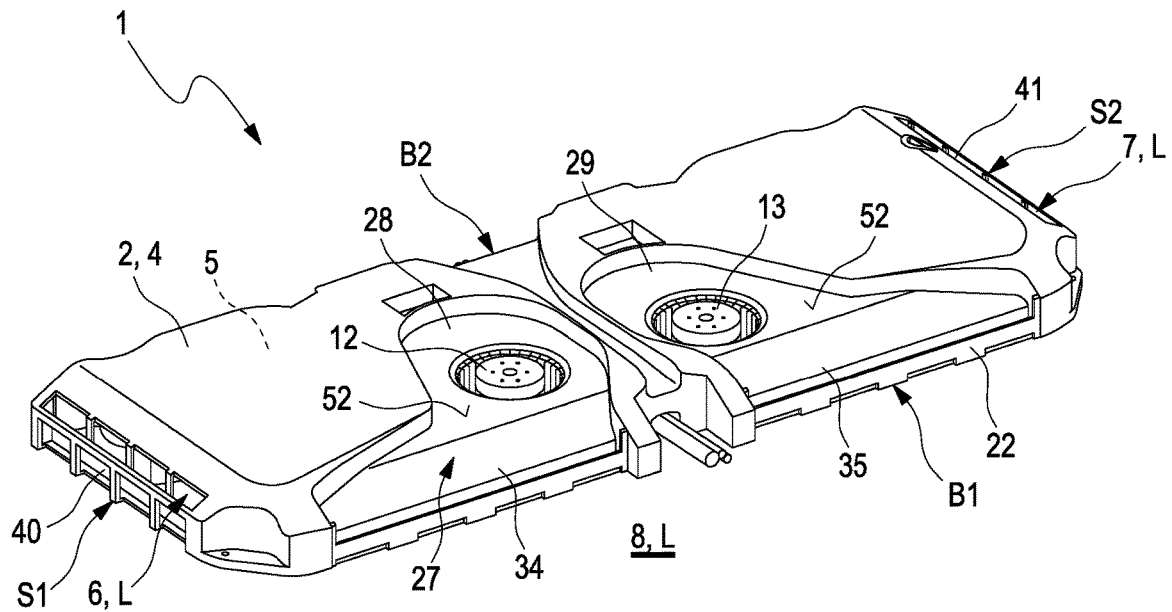
FIG. 1 shows a perspective illustration of an example of a cooling device according to the invention, with two air paths.
Figure 2:
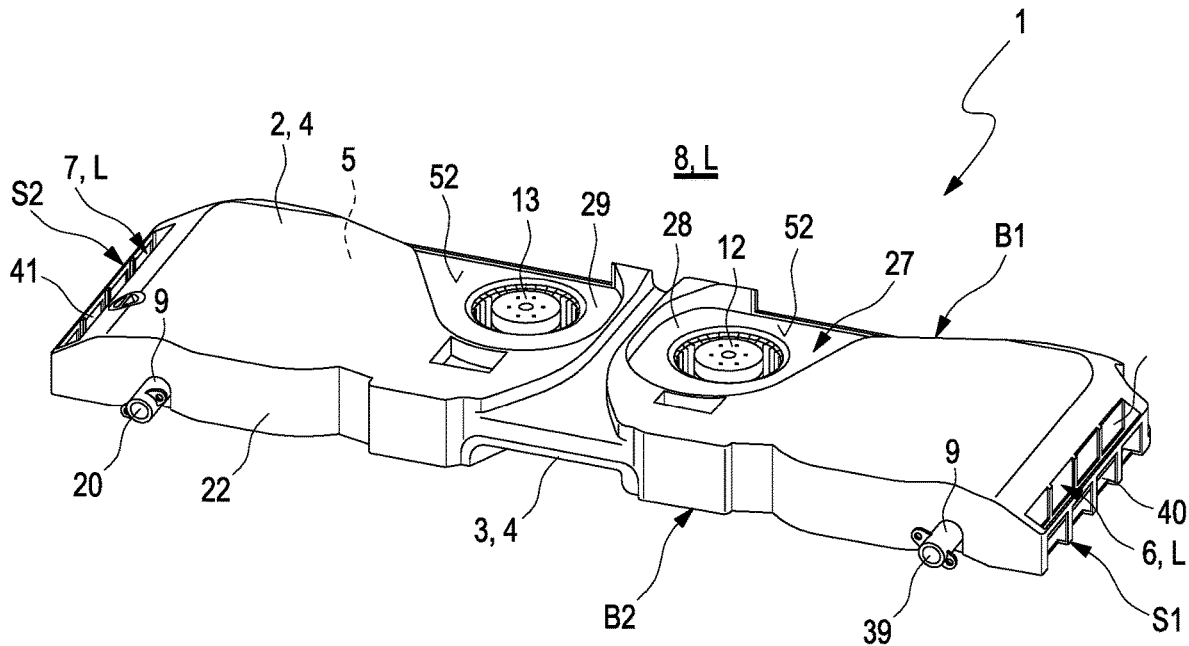
FIG. 2 shows the example of FIG. 1 in another perspective illustration.

FIGS. 1 and 2 illustrate in various perspectives an example of a cooling device 1. The cooling device 1 is configured for use in an electromagnetic induction charging device 50—which is not, however, illustrated in FIGS. 1 and 2—for the inductive charging of a motor vehicle (likewise not illustrated) with electrical energy. For this, the motor vehicle can comprise an electrical energy storage device in which the electrical energy can be stored after or respectively during the inductive charging. This energy store can be, for example, a traction battery for supplying an electric drive of the motor vehicle, The cooling device 1, shown by way of example, comprises a housing 4 with an upper and with a lower housing shell 2, 3. The housing 4 surrounds a housing interior 5.

Figure 3:
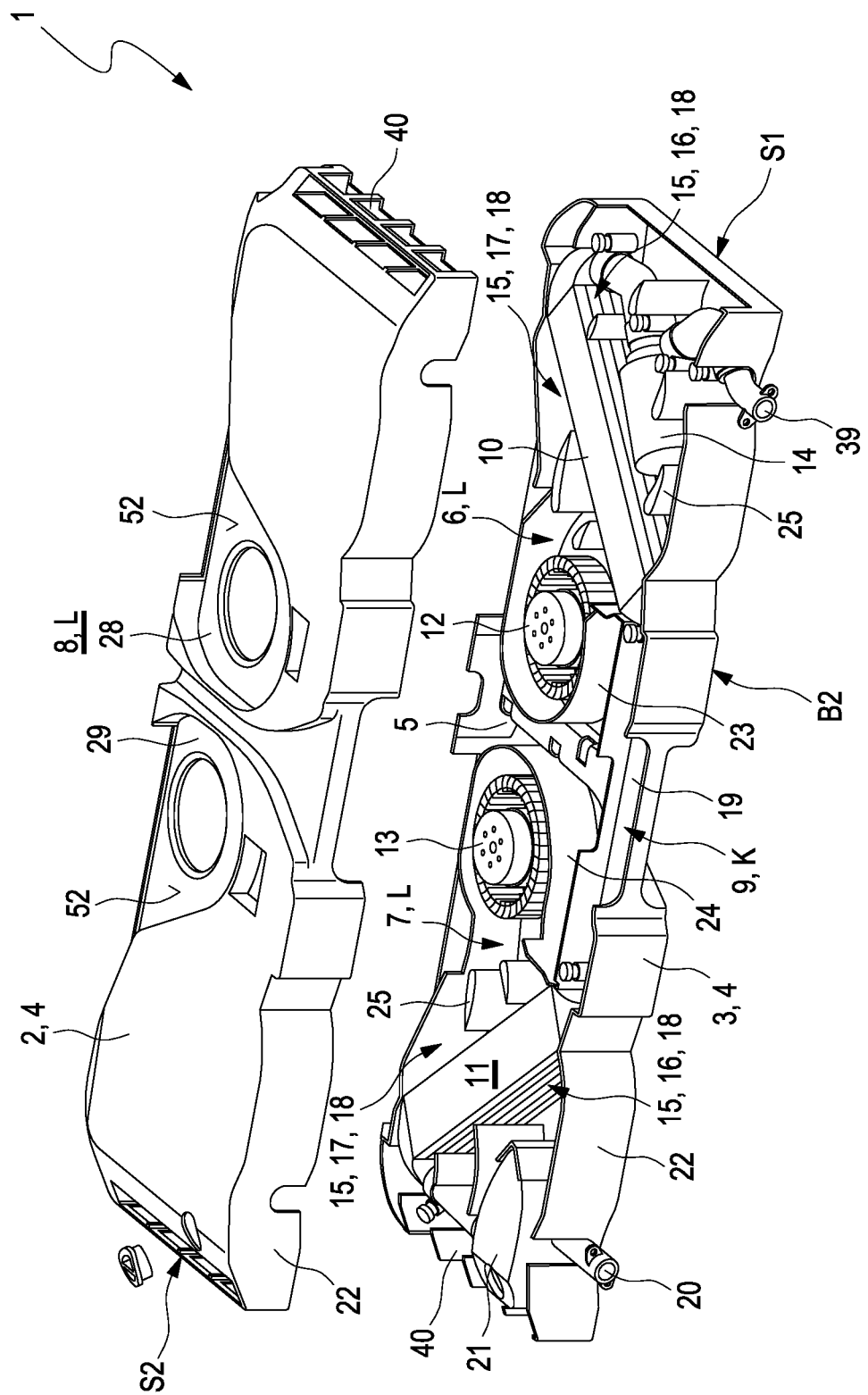
FIG. 3 shows the example of FIGS. 1 and 2 with removed upper housing shell in a perspective illustration.
Figure 4:
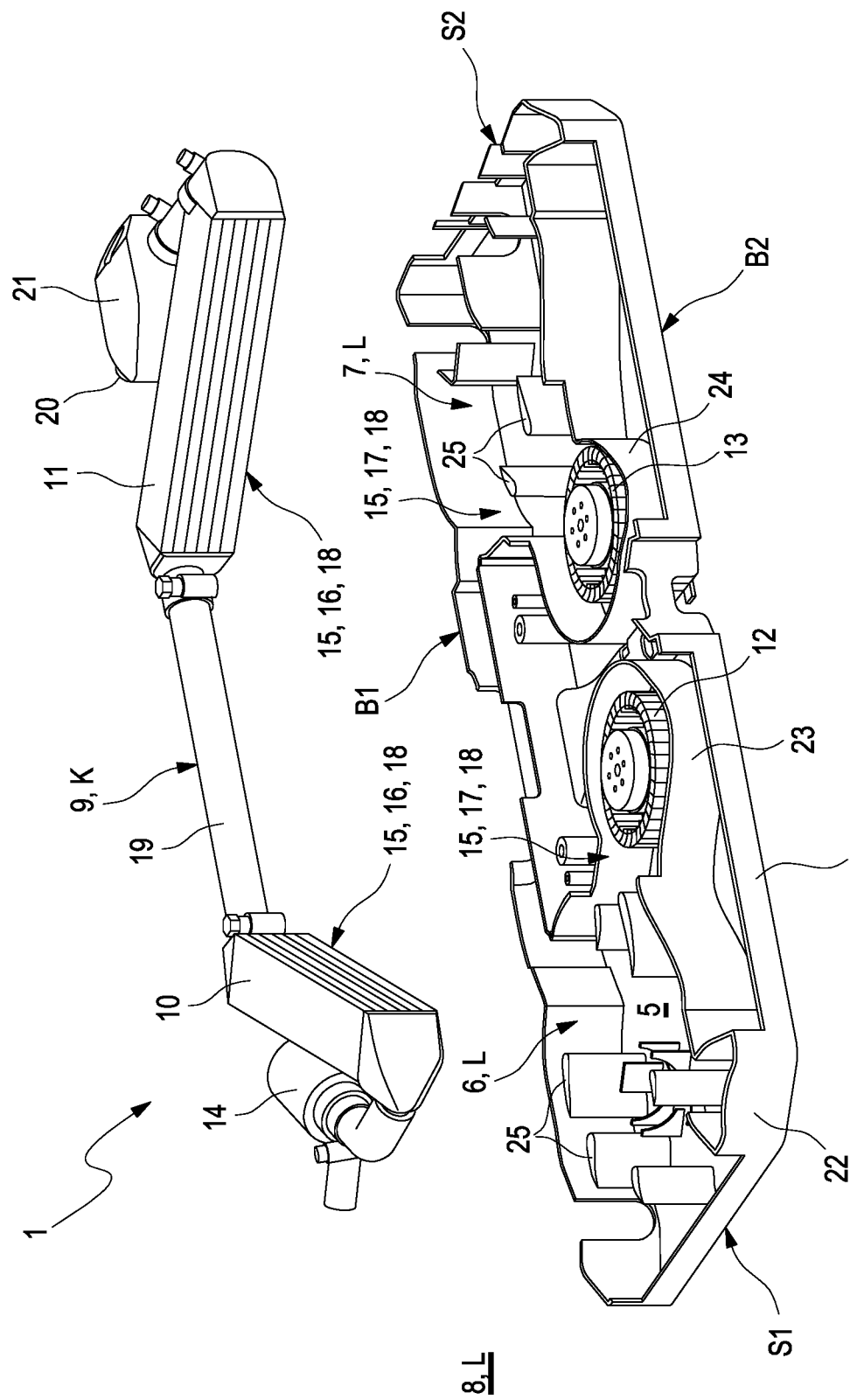
FIG. 4 shows the example of FIGS. 1 to 3 in a perspective exploded illustration without upper housing shell.
Figure 5:
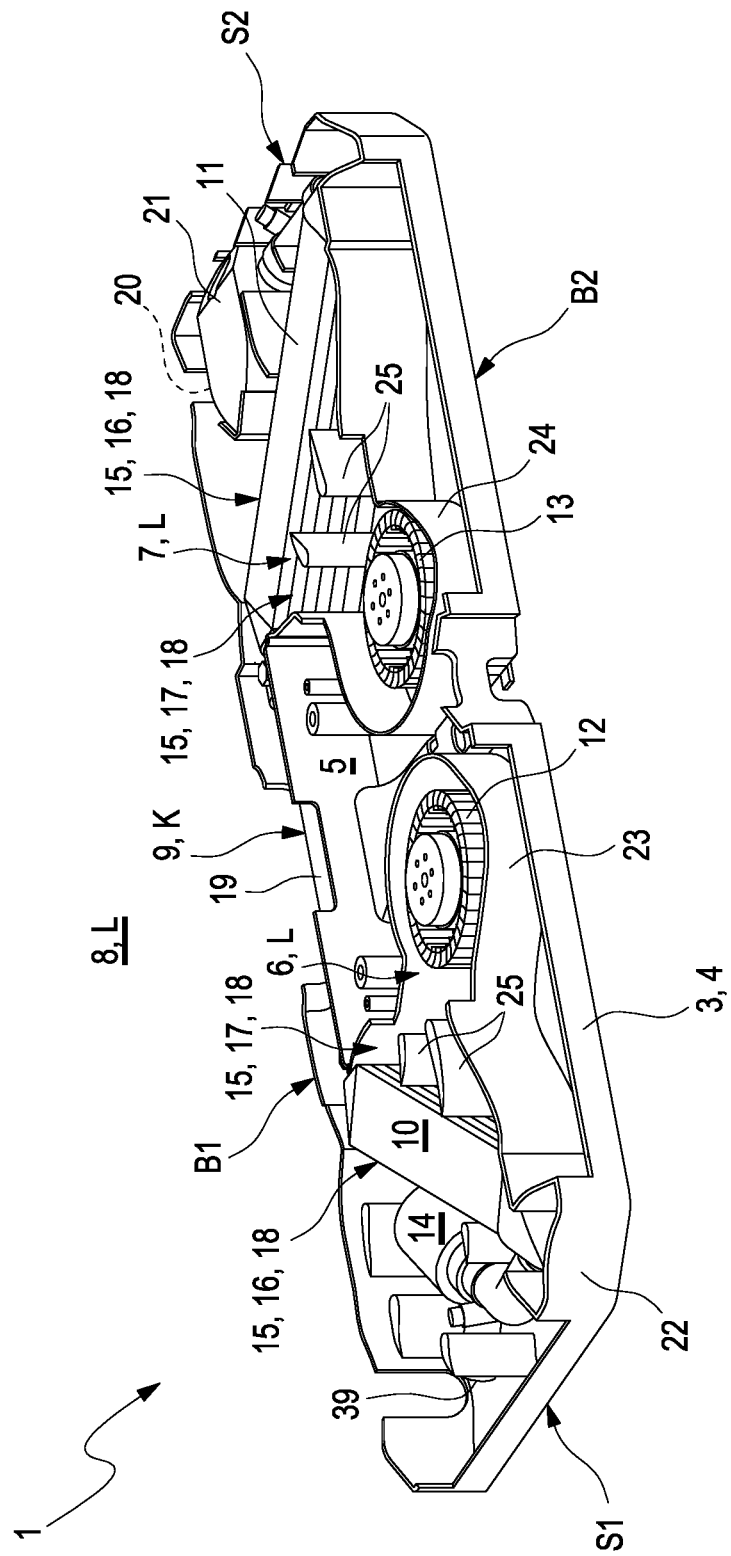
FIG. 5 shows the example of FIGS. 1 to 4 without upper housing shell in a perspective illustration.

In FIG. 3 the example of the cooling device 1 of FIGS. 1 and 2 according to the invention is shown in another perspective illustration, wherein for better illustration of the inner workings of the cooling device 1 the upper housing shell 2 is removed from the lower housing shell 3. FIG. 4 illustrates the cooling device 1 of FIGS. 1 to 3 in a perspective exploded illustration without the upper housing shell 2. In FIG. 5 the example of the cooling device 1 of FIGS. 1 to 4 is shown without upper housing shell.

According to FIGS. 1 to 5, a first and a second air path 6, 7 are arranged in the housing interior 5. The first and the second air path 6, 7 are able to be flowed through with air L from the environment 8 of the cooling device 1. In the housing interior 5 in addition a coolant path 9 is arranged, which is able to be flowed through with a coolant K. The air paths 6, 7 are fluidically separated with respect to the coolant path 9. A media exchange between the air paths 6, 7 and the coolant path 9 is therefore prevented. The cooling device 1 further comprises a first and a second heat exchanger 10, 11, which are arranged in the housing interior 5. Here, the coolant path 9 is directed through both heat exchangers 10, 11. The first air path 6 is directed through the first heat exchanger 10 and the second air path 7 is directed through the second heat exchanger 11, so that in the heat exchangers 10, 11 heat can be transferred from the coolant K to the air L. Here, the first heat exchanger 10 is arranged upstream of the second heat exchanger 11 in the coolant path 9. In addition, it can be seen that in the housing interior 5 a first and a second fan 12, 13 are arranged. The fans 12, 13 are configured, for example as shown, as radial fans. Here, the first fan 12 is arranged upstream of the first heat exchanger 10 in the first air path 6. The second fan 13 is present in the second air path 7 upstream of the second heat exchanger 11.

FIGS. 1 to 5 show, furthermore, that the cooling device 1 comprises a coolant pump 14, which is arranged in the coolant path 9 for conveying the coolant K through the coolant path 9. For example, the coolant pump 14, as illustrated, is present upstream of the first heat exchanger 10 in the coolant path 9. The first and the second air path 6, 7 in the housing interior 5 are configured for example fluidically separate from one another. The two fans 12, 13 are arranged between the two heat exchangers 10, 11 in the housing interior 5.

Figure 9:
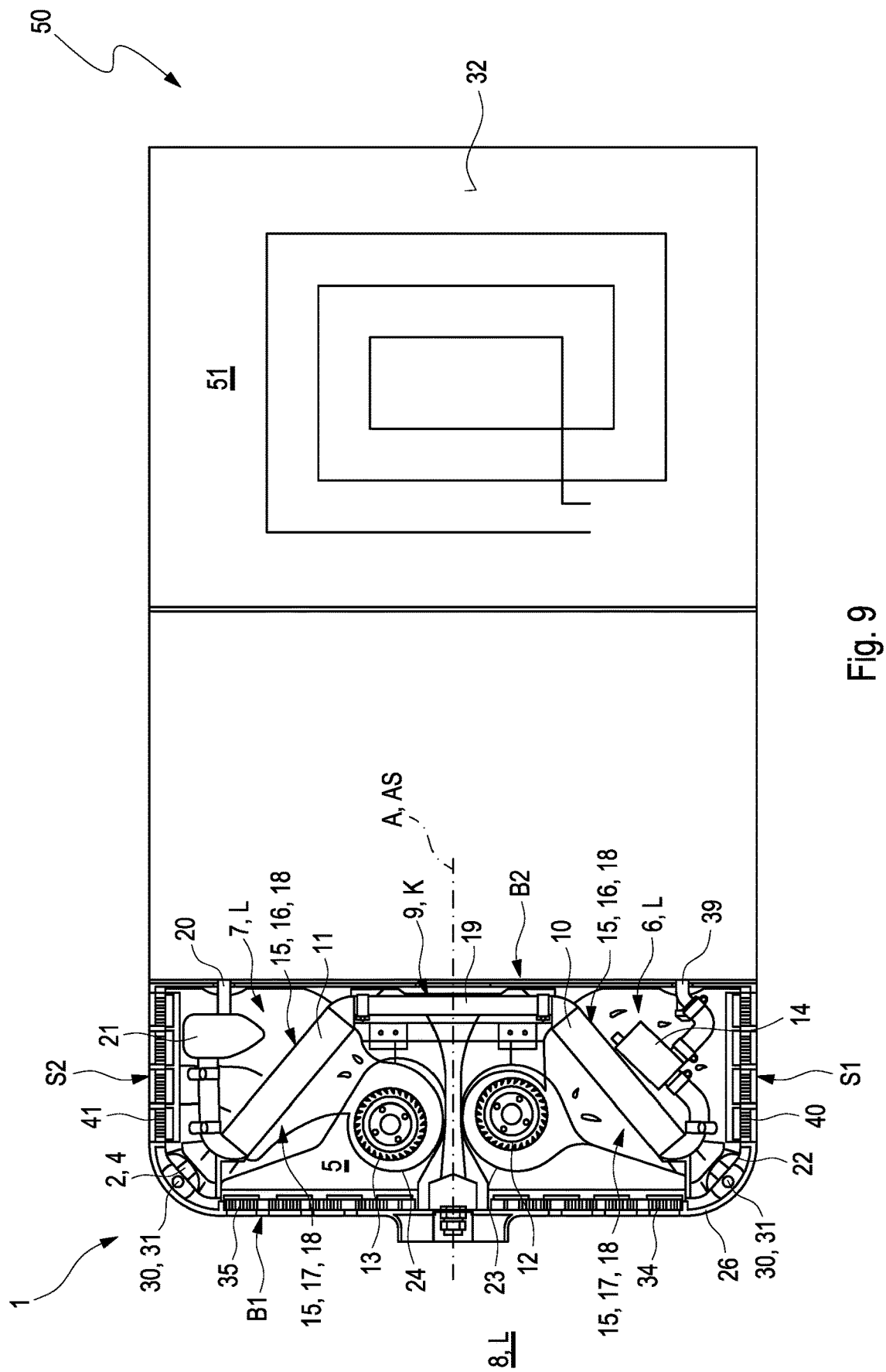
FIG. 9 shows an example of an electromagnetic induction charging device according to the invention with a cooling device according to the invention, also illustrated by way of example, in a top view onto an underside of the induction charging device or respectively of the cooling device.

In FIG. 9 in a top view onto an underside 32 by way of example an electromagnetic induction charging device 50 according to the invention for the inductive charging of a motor vehicle is shown, which comprises the cooling device 1. The electromagnetic induction charging device 50 comprises in addition an electromagnetic resonator 51 for the inductive transferring of electrical energy to the motor vehicle. Here, the coolant path 9 of the cooling device 1 communicates fluidically with the resonator 51 in such a way that the resonator 51 is able to be cooled by means of the coolant K which is directed through the coolant path 9. However, an indirect cooling of the resonator 51 via air is also conceivable. Furthermore, the ferrite elements can also be cooled. Moreover, electronic components such as power electronics components can be cooled. The cooling can take place either through direct cooling with the coolant or indirectly via air. Direct cooling also includes here that the coolant for example cools a metal plate on which then elements which are to be cooled are mounted and not only the direct washing around of the components with coolant.

Waste heat which occurs on the inductive transmission of electrical energy at or respectively in the resonator 51 can therefore be received by means of the coolant K and transported away from the resonator 51 via the coolant path 9. The coolant path 9 is, for example, part of a closed coolant circuit which can run entirely within the induction charging device 50. Here, the resonator 51, in accordance with the example of FIG. 9, is arranged for example in the housing interior 5 of the housing 4 of the cooling device 1. This means that the housing 4 of the cooling device 1 can also form, at the same time, the housing of the induction charging device 50. Alternatively, the resonator 51 can however also be housed in a separate resonator housing to the housing 4 of the cooling device 1. A dividing wall or similar can be provided to the main part of the induction charging device 50. With indirect cooling, a further separate air path can be present in the main part.

It can be seen furthermore from FIG. 9 that the two air paths 6, 7 and the two heat exchangers 10, 11 and the two fans 12, 13 are arranged with respect to a shared mirror axis A in a substantially mirrored manner with respect to one another. The air paths 6, 7, the two heat exchangers 10, 11 and the two fans 12, 13 can be arranged axially symmetrically to one another with respect to a symmetry axis AS.

FIGS. 3 to 5 and 9 show furthermore that the two heat exchangers 10, 11 are arranged in a V-shaped manner with respect to one another. For example, the first and the second heat exchanger 10, 11 extend substantially respectively along one of two legs 15 of a heat exchanger V-geometry 16. The first and the second air path 6, 7 extend for example respectively along one of two legs 15 of an air path V-geometry 17. Here, the heat exchanger V-geometry 16 and the air path V-geometry 17 overlap one another in such a way that they form together a hash(#)-geometry 18. The heat exchanger V-geometry 16 and the air path V-geometry 17 are therefore arranged opening reciprocally in the hash(#)-geometry 18.

For example, the two heat exchangers 10, 11 are arranged fluidically consecutively in the coolant path 9, connected by means of a coolant line 19. In the coolant path 9 for example an equalizing receptacle 21 is arranged for the equalization of changes in volume of the coolant K which is directed through the coolant path 9. The coolant pump 14 and the equalizing receptacle 21 can be arranged—in interaction with the arrangement of the heat exchangers 10, 11 and fans 12, 13—as far as possible in a manner saving installation space in the corners of the cooling device 1 which are not occupied by the heat exchangers 10, 11 and the fans 12, 13 within the first and/or second air path 6, 7.

In accordance with the example of FIGS. 1 to 5 the upper housing shell 2 is connected by its shell edge 22 with a shell edge 23 of the lower housing shell 3. Here, the two shell edges 22 of the upper housing shell 2 and of the lower housing shell 3 are joined to one another in a joining plane. The shell edges 22 can be realized in a collar-like manner and can overlap one another at least partially. The lower housing shell 3 comprises, facing the housing interior 5, respectively integrally a first fan housing 23 of the first fan 12 and a second fan housing 24 of the second fan 13. The lower housing shell 3 comprises in addition, facing the housing interior 5, at least one flow-guiding element 25 for directing the air L through the first or respectively second air path 6, 7 integrally. This means that the lower housing shell 3 and the first or respectively second fan housing 23, 24 and the at least one flow-guiding element 25 can be formed in a uniform material with respect to one another. The fan housing 23, 24 and the flow-guiding element 25 can be delivered along a common demoulding direction and without undercuts with respect to the demoulding direction, so that the lower housing shell 3, realized in one piece, can be injection-moulded free of core and slide.

Figure 6:
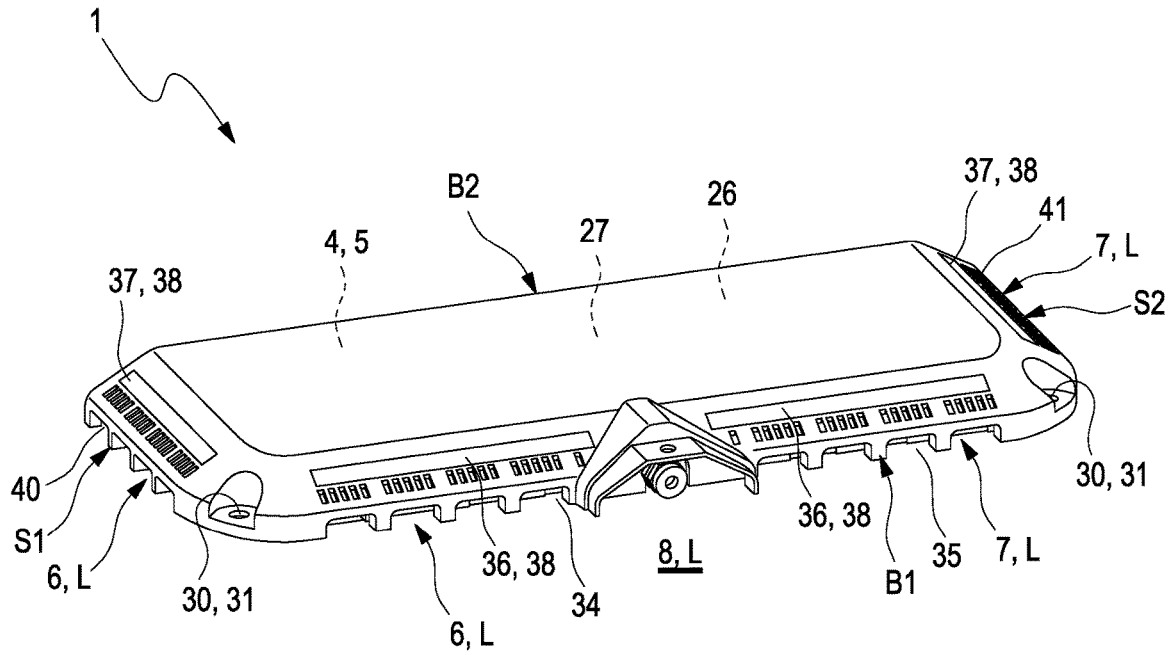
FIG. 6 shows a further example of a cooling device according to the invention in a perspective illustration.
Figure 7:
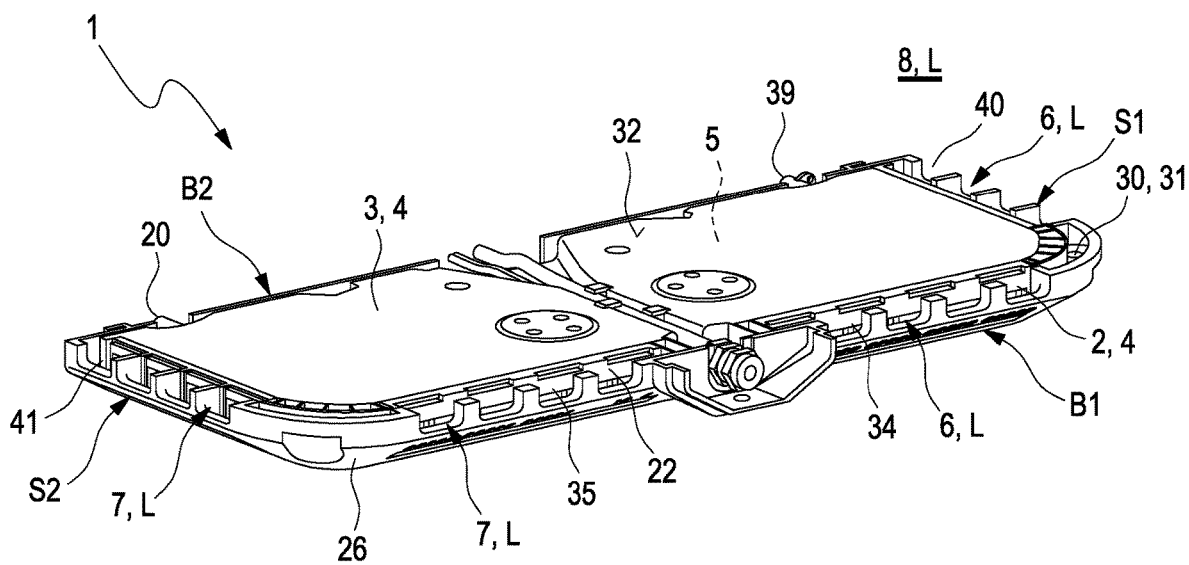
FIG. 7 shows the example of FIG. 6 in another perspective illustration.
Figure 8:
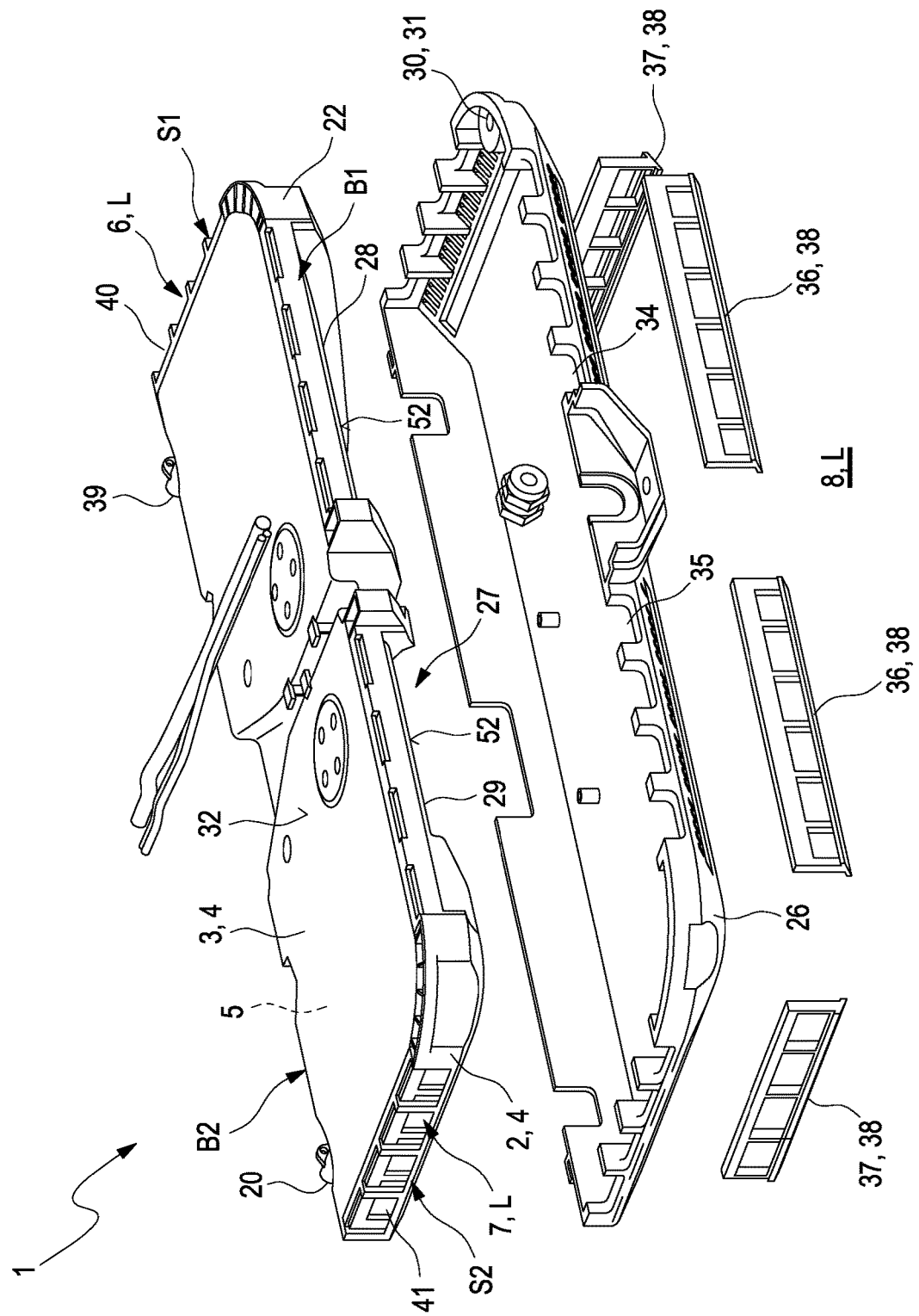
FIG. 8 shows the example of FIGS. 6 and 7 in a perspective exploded illustration.

In FIGS. 6 and 7 a further example of a cooling device 1 according to the invention with two air paths is illustrated in different perspectives. FIG. 8 illustrates the example of FIGS. 6 and 7 in a perspective exploded illustration. Accordingly, on the upper housing shell 2 a covering 26 is arranged. Between the upper housing shell 2 and the covering 26 an intermediate space 27 is formed. The intermediate space 27 in turn forms a first air inlet path 28 for the feeding of the air L to the first fan 12, and a second air inlet path 29 for the feeding of the air L to the second fan 13. According to the example which is shown, the first and the second air inlet path 28, 29 are configured separated fluidically with respect to one another. Alternatively and contrary to the example which is shown, the first and the second air inlet path 28, 29 can, however, also form together a main air inlet path, in which the first and the second air inlet path 28, 29 are connected fluidically with one another.

According to FIGS. 6 to 8 and FIG. 9, the covering 26 comprises receiving elements 30. The receiving elements 30 are configured for example respectively as aperture 31. In the receiving elements 30 or respectively in the apertures 31, fastening elements—not shown—, for example fastening screws, can be received for the fixing of the covering 26 and of the entire cooling device 1 on a surface. Such a surface can be, for example, a substrate such as a roadway or respectively as a parking space for the motor vehicle which is to be charged inductively.

In accordance with FIGS. 1 to 9, the second fan 13 is arranged in a second air inlet 35 for the introducing of air L into the second air path. Here, the second air inlet 35 can communicate fluidically with the second air inlet path 29. Alternatively or additionally, the first fan 12 is arranged in a first air inlet 34 for the introducing of air L into the first air path 6. Here, the first air inlet 34 can communicate fluidically with the first air inlet path 28.

FIGS. 6 and 8 illustrate furthermore that upstream of the first fan 12 a first supply air filter device 36 is arranged for filtering the air L entering into the first air path 6. In addition, upstream of the second fan 13 a second supply air filter device 36 is arranged for filtering the air L entering into the second air path 7. Downstream of the first heat exchanger 10 a first exhaust air filter device 37 is present for filtering the air L exiting from the first air path 6. Downstream of the second heat exchanger 11 a second exhaust air filter device 37 is present for filtering the air L exiting form the second air path 7. It shall be understood that also individual ones of these four filter devices 36, 37 shown in FIGS. 6 and 8 can be dispensed with. At least one of the filter devices 36, 37—each of the filter devices 36, 37 in the example of FIGS. 6 and 8—is or respectively are configured as a filter cassette 38 which is able to be used exchangeably.

According to FIGS. 1 to 9—best visible, however, in FIG. 9—the housing 4 in a top view onto the upper or lower housing shell 2, 3 has the geometric shape of a rectangle, which comprises a first and a second wide side B1, B2 and a first and a second narrow side S1, S2. In a manner typical of a rectangle, the two narrow sides S1, S2 lie opposite one another and are connected with one another in an angular manner by means of the wide sides B1, B2, likewise lying opposite one another, wherein the narrow sides S1, S2 are shorter than the wide sides B1, B2. Here, the first and the second air inlet 34, 35 are both arranged in the first wide side B1.

A coolant inlet 39 of the coolant path 9 and the coolant outlet 20 of the coolant path 9 are arranged in the second wide side B2 lying opposite the first wide side B1. The first air path 6 opens for example into a first air outlet 40, arranged in the housing 4, for directing the air L out from the housing interior 5. The second air path 7 opens for example into a second air outlet 41, arranged in the housing 4, for directing the air L out from the housing interior 5. Here, the first air outlet 40 is arranged in the first narrow side S1 and the second air outlet 41 is arranged in the second narrow side S2, therefore lying opposite one another.

In accordance with the examples of FIGS. 1 to 9, the two heat exchangers 10, 11 are respectively configured as tube bundle heat exchangers. Such a tube bundle heat exchanger comprises a bundle of cooling tubes which together form a portion of the coolant path 9 and which are combined fluidically at both ends in each case by means of a collector and by means of a distributor. The cooling tubes of the bundle are therefore connected fluidically in a parallel manner to one another by means of the collector and the distributor. Between the cooling tubes of the bundle intermediate spaces are present which can be flowed through by the air L in a fluidically separated manner with respect to the coolant K flowing through the cooling tubes but thermally coupled to the coolant K. A boundary surface 52 of the upper housing shell 2, which delimits one of the air inlet paths 28, 29, runs at a gradient in operating position of the cooling device 1. For example, boundary surfaces 52 of the upper housing shell 2, delimiting the air inlet paths 28, 29, run at a gradient in operating position of the cooling device 1. It is thereby achieved that fluid such as splash water or rainwater penetrating into the air inlet paths 28, 29 can be directed away and kept away from the fans 12, 13 due to gravity.

Figure 10:
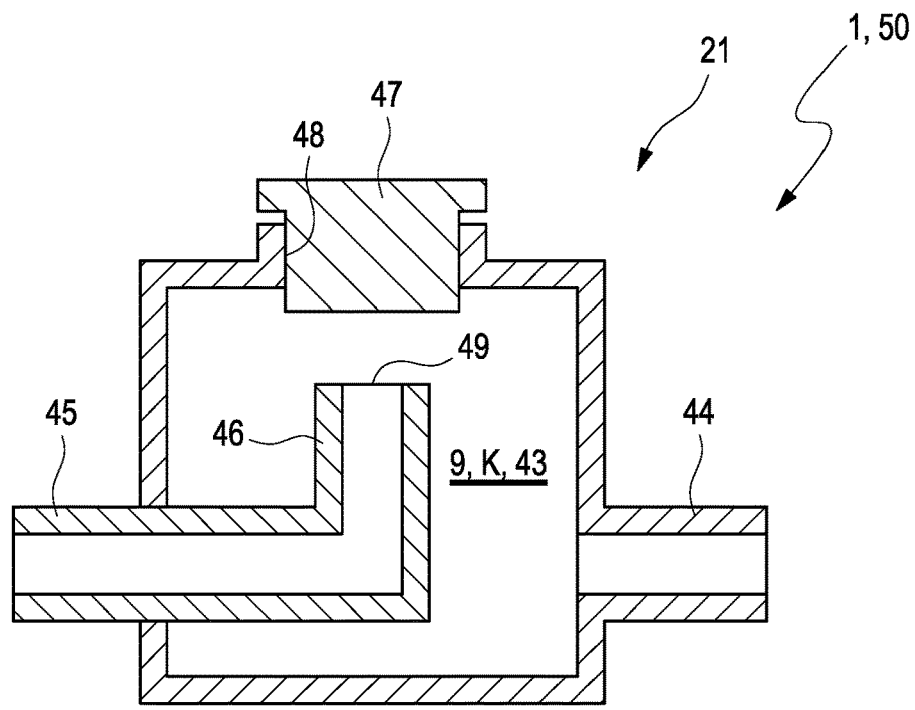
FIG. 10 shows by way of example an equalizing receptacle for the cooling device according to the invention.

In FIG. 10 an example of the equalizing receptacle 21 of the cooling device 1 is shown in section, which can correspond to that of FIGS. 1 to 9. It can be seen that the equalizing receptacle 21 delimits a receptacle interior 43 for receiving the coolant K. The equalizing receptacle 21 has an inlet connection piece 44 which, facing away from the receptacle interior 43, protrudes from the equalizing receptacle 21. The equalizing receptacle 21 comprises furthermore an outlet connection piece 45 which, facing away from the receptacle interior 43, protrudes from the equalizing receptacle 21. By means of these connection pieces 44, 45 the equalizing receptacle 21 is integrated fluidically into the coolant path 9. The equalizing receptacle 21 comprises furthermore a filling connection piece 46 for filling the equalizing receptacle 21 with coolant K. For example, the filling connection piece 46 serves for filing the coolant path 9 with coolant K. Here, the filling connection piece 46 projects into the receptacle interior 43 and connects the outlet connection piece 45 fluidically with the receptacle interior 43. The outlet connection piece 45 is arranged for example in extension of the filling connection piece 46. In the example which is shown, the filling connection piece 46 is configured in an angled manner. The equalizing receptacle 21 has a receptacle opening 48 which in the example of FIG. 10 is closed by means of a detachable cover 47. A filling opening 49 of the filling connection piece 46 points in the direction of the receptacle opening 48.

Figure 11:
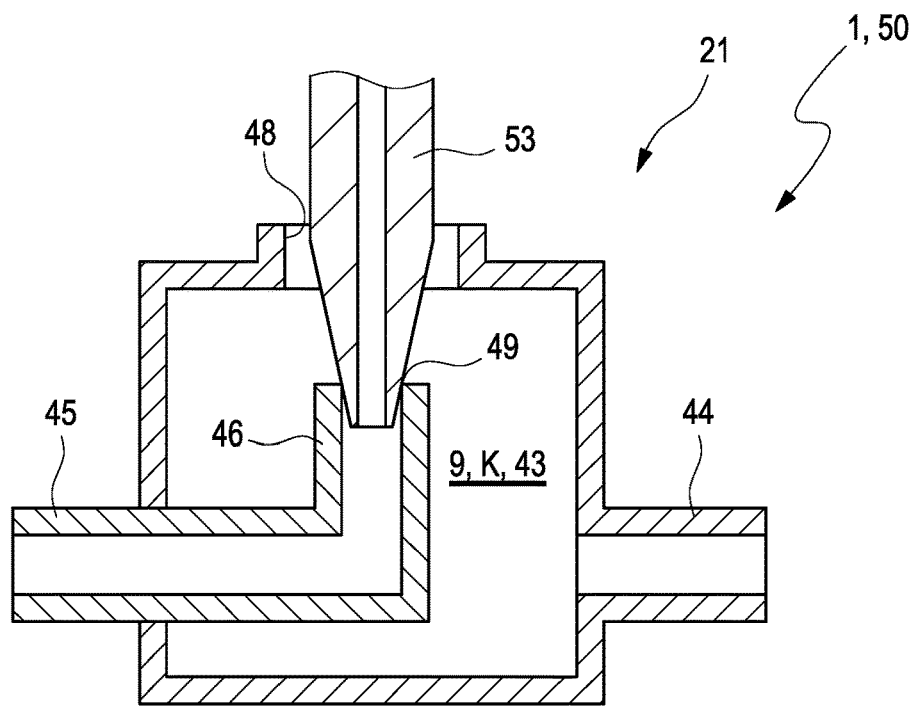
FIG. 11 shows the equalizing receptacle of FIG. 10 on filling with a coolant.

FIG. 11 illustrates, likewise in section, the example of FIG. 10, wherein according to FIG. 11 the cover 47 is removed, so that coolant K can be filled into the filling connection piece 46 via the filling opening 49. It can be seen that the receptacle opening 48 and the filling opening 49 of the filling connection piece 46 are aligned. When the cover 47 is detached, simultaneously via the filling opening 49 coolant K can be filled into the filling connection piece 46 and via the filling opening 48 the receptacle interior 43 can be vented. According to FIG. 11, for filling the filling connection piece 46 with coolant K a filling device 53 is used, which is connected in a fluid-tight manner to the filling opening 49 of the filling connection piece 46 by a sealing cone through the receptacle opening 48. Here, between the receptacle opening 48 and the filling device 53 a gap is formed, through which the receptacle interior 43 or respectively the coolant path 9 can be vented on filling with coolant K.

The cooling device 1 of FIGS. 1 and 9 according to invention is configured for an application in an electromagnetic induction charging device 50 for the inductive charging of a motor vehicle with electrical energy. The cooling device 1 comprises a housing 4 with an upper and with a lower housing shell 2, 3, which surrounds a housing interior 5. The cooling device 1 comprises an air path 6 or respectively 7, arranged in the housing interior 5, for flowing through with air L from an environment 9 of the cooling device 1. The cooling device 1 comprises, furthermore, a coolant path 9, arranged in the housing interior 5 in fluidically separated manner with respect to the air path 6 or respectively 7, for flowing through with a coolant K. The cooling device 1 further has a heat exchanger 10 or respectively 11 arranged in the housing interior 5, wherein the coolant path 9 is directed through the heat exchanger 10 or respectively 11. The air path 6 or respectively 7 is likewise directed through the heat exchanger 10 or respectively 11, so that the heat exchanger 10 or respectively 11 for the cooling of the coolant K can transfer heat from the coolant K to the air L. Moreover, in the housing interior 5 a fan 12 or respectively 13 is arranged, which is configured for example as a radial fan. Here, the fain 12 or respectively 13 is arranged upstream of the heat exchanger 10 or respectively 11 in the air path 6 or respectively 7. In other words the cooling device 1 can therefore correspond precisely to one of two halves of the cooling device 1 according to FIG. 9, which are separated by the mirror axis A or respectively the symmetry axis AS.

By means of the cooling device 1 according to the invention, waste heat at a level of up to 1 kW can be transported from the resonator 51 of the induction charging device 50. The electric charging power which can be provided by means of the induction charging device 50 amounts to approximately 11 kW.

The invention claimed is:

1. A cooling device for an electromagnetic induction charging device for inductive charging of a motor vehicle with electrical energy, the cooling device comprising:
    a housing including an upper housing shell and a lower housing shell which surround a housing interior;
    at least one air path through which air from an environment of the cooling device is flowable, the at least one air path arranged in the housing interior;
    a coolant path through which a coolant is flowable, the coolant path arranged in the housing interior fluidically separated from the at least one air path;
    at least one heat exchanger arranged in the housing interior, the coolant path and the at least one air path directed through the at least one heat exchanger such that, in the at least one heat exchanger, heat is transferrable from the coolant to the air to cool the coolant;
    at least one fan arranged in the housing interior; and
    wherein the at least one fan is arranged upstream of the at least one heat exchanger in the at least one air path.

2. The cooling device according to claim 1, wherein:
    the at least one air path includes a first air path and a second air path;
    the at least one heat exchanger includes a first heat exchanger and a second heat exchanger;
    the at least one fan includes a first fan and a second fan;
    the coolant path is directed through both the first heat exchanger and the second heat exchanger;
    the first air path is directed through the first heat exchanger;
    the second air path is directed through the second heat exchanger;
    the first heat exchanger is arranged upstream of the second heat exchanger in the coolant path;
    the first fan is arranged upstream of the first heat exchanger in the first air path; and
    the second fan is arranged upstream of the second heat exchanger in the second air path.

3. The cooling device according to claim 2, wherein the first air path and the second air path are configured fluidically separate from one another in the housing interior.

4. The cooling device according to claim 2, wherein the first fan and the second fan are arranged between the first heat exchanger and the second heat exchangers in the housing interior.

5. The cooling device according to claim 2, wherein the first air path and the second air path, the first heat exchanger and the second heat exchanger, and the first fan and the second fan are arranged substantially mirrored with respect to a shared mirror axis with respect to one another.

6. The cooling device according to claim 2, wherein the first heat exchanger and the second heat exchanger are arranged in a V-shaped manner with respect to one another in the housing interior.

7. The cooling device according to claim 2, wherein:
    the first heat exchanger and the second heat exchanger respectively extend along one of two legs of a heat exchanger V-geometry;

the first air path and the second air path respectively extend along one of two legs of an air path V-geometry; and the heat exchanger V-geometry and the air path V-geometry overlap one another and collectively form a hatch-geometry.

8. The cooling device according to claim 2, wherein the first heat exchanger and the second heat exchanger are arranged in the coolant path fluidically consecutively and are connected via a coolant line.

9. The cooling device according to claim 2, wherein the lower housing shell includes, facing the housing interior:
an integral first fan housing of the first fan;
an integral second fan housing of the second fan; and
at least one integral flow-guiding element structured and arranged to direct the air through at least one of the first air path and the second air path.

10. The cooling device according to claim 2, further comprising a covering arranged on the upper housing shell, wherein:
an intermediate space is defined between the upper housing shell and the covering; and
the intermediate space forms (i) a first air inlet path for feeding of the air to the first fan and (ii) a second air inlet path for feeding of the air to the second fan.

11. The cooling device according to claim 10, wherein one of:
the first air inlet path and the second air inlet path are fluidically separate with respect to one another; and
the first air inlet path and the second air inlet path together form a main air inlet path such that the first air inlet path and the second air inlet path are fluidically connected with one another.

12. The cooling device according to claim 10, wherein the covering includes a plurality of receiving elements configured to receive a plurality of fastening elements to couple at least one of (i) the covering and (ii) the cooling device on a surface.

13. The cooling device according to claim 10, wherein at least one of:
the first fan is arranged in a first air inlet for directing the air into the first air path, and the first air inlet is in fluidical communication with the first air inlet path; and
the second fan is arranged in a second air inlet for directing the air into the second air path, and the second air inlet is in fluidical communication with the second air inlet path.

14. The cooling device according to claim 13, wherein:
the housing, in a top view onto at least one of the upper housing shell and the lower housing shell, has a geometric shape of a rectangle with a first wide side, a second wide side, a first narrow side, and a second narrow side;
the first air inlet and the second air inlet are both arranged in the first wide side; and
a coolant inlet and a coolant outlet of the coolant path are arranged in the second wide side, which is disposed opposite the first wide side.

15. The cooling device according to claim 14, wherein:
the first air path opens into a first air outlet for directing the air out of the housing interior;
the second air path opens into a second air outlet for directing the air out of the housing interior;
the first air outlet is arranged in the first narrow side of the housing; and
the second air outlet is arranged in the second narrow side, which is disposed opposite the first narrow side.

16. The cooling device according to claim 10, wherein:
the upper housing shell has a first boundary surface and a second boundary surface, the first boundary surface at least partially delimiting the first air inlet path, the second boundary surface at least partially delimiting the second air inlet path;
the first boundary surface and the second boundary surface of the upper housing shell, when the cooling device is in an operating position, extend at least partially at a gradient such that (i) fluid penetrating into the first air inlet path is directed away from the first fan via gravity and (ii) fluid penetrating into the second air inlet path is directed away from the first fan via gravity.

17. The cooling device according to claim 2, wherein at least one of:
a first supply air filter device is arranged upstream of the first fan for filtering of the air entering into the first air path;
a second supply air filter device is arranged upstream of the second fan for filtering of the air entering into the second air path;
a first exhaust air filter device is arranged downstream of the first heat exchanger for filtering of the air exiting from the first air path; and
a second exhaust air filter device is arranged downstream of the second heat exchanger for filtering of the air exiting from the second air path.

18. The cooling device according to claim 17, wherein at least one of the first supply air filter device, the second supply air filter device, the first exhaust air filter device, and the second exhaust air filter devices is configured respectively as an exchangeable filter cassette.

19. The cooling device according to claim 1, further comprising a coolant pump arranged in the coolant path and configured to convey the coolant through the coolant path.

20. The cooling device according to claim 1, further comprising an equalizing receptacle arranged in the coolant path downstream of the at least one heat exchanger, wherein the equalizing receptacle is configured to receive the coolant which is directed through the coolant path.

21. The cooling device according to claim 20, wherein:
the equalizing receptacle delimits a receptacle interior for receiving the coolant;
the equalizing receptacle includes an inlet connection piece via which the coolant is flowable into the receptacle interior, the inlet connection piece facing away from the receptacle interior and protruding from the equalizing receptacle;
the equalizing receptacle further includes an outlet connection piece via which the coolant is flowable out of the receptacle interior, the outlet connection piece facing away from the receptacle interior and protruding from the equalizing receptacle;
the equalizing receptacle is fluidically integrated into the coolant path via the inlet connection piece and the outlet connection piece;
the equalizing receptacle further includes a filling connection piece via which the equalizing receptacle is fillable with the coolant; and
the filling connection piece projects into the receptacle interior and fluidically connects the outlet connection piece with the receptacle interior.

22. The cooling device according to claim 21, wherein the outlet connection piece extends from the filling connection piece.

23. The cooling device according to claim 21, wherein the filling connection piece is configured in an angled manner.

24. The cooling device according to claim 21, wherein:
the equalizing receptacle has a receptacle opening which is closable via a detachable cover; and
the filling connection piece including a filling opening pointing in a direction of the receptacle opening.

25. The cooling device according to claim 24, wherein the receptacle opening and the filling opening are aligned such that, when the cover is detached, the filling connection piece is fillable with the coolant via the filling opening and simultaneously the receptacle interior is ventable via the receptacle opening.

26. The cooling device according to claim 1, wherein:
a first shell edge of the upper housing shell is connected with a second shell edge of the lower housing shell; and
the first shell edge and the second shell edges are joined to one another in a joining plane.

27. The cooling device according to claim 1, wherein the at least one heat exchanger is configured as a tube bundle heat exchanger.

28. The cooling device according to claim 1, wherein:
a boundary surface of the upper housing shell delimits an air inlet path; and
in an operating position of the cooling device, the boundary surface extends at least partially at a gradient such that fluid penetrating into the air inlet path is directed away from the at least one fan via gravity.

29. An electromagnetic induction charging device, comprising:
a cooling device including:
a housing including an upper housing shell and a lower housing shell which surround a housing interior;
at least one air path through which air from an environment of the cooling device is flowable, the at least one air path arranged in the housing interior;
a coolant path through which a coolant is flowable, the coolant path arranged in the housing interior fluidically separated from the at least one air path;
at least one heat exchanger arranged in the housing interior, the coolant path and the at least one air path directed through the at least one heat exchanger such that, in the at least one heat exchanger, heat is transferrable from the coolant to the air to cool the coolant; and
at least one fan arranged in the housing interior, the at least one fan arranged upstream of the at least one heat exchanger in the at least one air path;
an electromagnetic resonator configured for inductive transmission of electrical energy to a motor vehicle; and
wherein the coolant path communicates fluidically with the electromagnetic resonator such that the electromagnetic resonator is coolable via the coolant directed through the coolant path.

30. The induction charging device according to claim 29, further comprising a closed coolant circuit that extends entirely within the induction charging device, wherein the coolant path is configured as part of the closed coolant circuit.

31. The induction charging device according to claim 29, wherein at least one of:
the electromagnetic resonator is arranged in the housing interior of the housing of the cooling device; and
the electromagnetic resonator is arranged in a resonator housing configured separately with respect to the housing of the cooling device.

* * * * *